United States Patent
Lin et al.

(10) Patent No.: US 9,087,946 B2
(45) Date of Patent: Jul. 21, 2015

(54) LIGHT EMITTING DEVICE

(71) Applicant: EPISTAR CORPORATION, Hsinchu (TW)

(72) Inventors: Yu-Yao Lin, Hsinchu (TW); Yen-Chih Chen, Hsinchu (TW); Chien-Yuan Tseng, Hsinchu (TW); Tsun-Kai Ko, Hsinchu (TW); Chun-Ta Yu, Hsinchu (TW); Shih-Chun Ling, Hsinchu (TW); Cheng-Hsiung Yen, Hsinchu (TW); Hsin-Hsien Wu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 76 days.

(21) Appl. No.: 13/661,556

(22) Filed: Oct. 26, 2012

(65) Prior Publication Data
US 2014/0117306 A1    May 1, 2014

(51) Int. Cl.
*H01L 33/04* (2010.01)
*H01L 33/12* (2010.01)
*H01L 33/32* (2010.01)

(52) U.S. Cl.
CPC ............ *H01L 33/04* (2013.01); *H01L 33/12* (2013.01); *H01L 33/32* (2013.01)

(58) Field of Classification Search
CPC .......... H01L 33/12; H01L 33/04; H01L 33/06
See application file for complete search history.

(56) References Cited

U.S. PATENT DOCUMENTS

| | | | | |
|---|---|---|---|---|
| 6,055,253 A * | 4/2000 | Kidoguchi et al. | ........ | 372/45.01 |
| 6,744,064 B2 * | 6/2004 | Lee et al. | ........ | 257/13 |
| 7,067,838 B1 * | 6/2006 | Sato et al. | ........ | 257/17 |
| 7,792,171 B2 * | 9/2010 | Kohda et al. | ........ | 372/45.012 |
| 8,426,844 B2 * | 4/2013 | Moon et al. | ........ | 257/14 |
| 2007/0290230 A1 * | 12/2007 | Kawaguchi et al. | ........ | 257/196 |
| 2008/0023689 A1 * | 1/2008 | Kim et al. | ........ | 257/13 |
| 2009/0224226 A1 * | 9/2009 | Huang et al. | ........ | 257/13 |
| 2011/0140083 A1 * | 6/2011 | Driscoll et al. | ........ | 257/15 |
| 2012/0104360 A1 * | 5/2012 | Hardy et al. | ........ | 257/18 |

* cited by examiner

*Primary Examiner* — Fernando L Toledo
*Assistant Examiner* — Bryan Junge
(74) *Attorney, Agent, or Firm* — Muncy, Geissler, Olds & Lowe, P.C.

(57) ABSTRACT

A light-emitting device comprises a first type semiconductor layer, a multi-quantum well structure on the first type semiconductor layer, and a second type semiconductor layer on the multi-quantum well structure, wherein the multi-quantum well structure comprises a first portion near the first type semiconductor layer, a second portion near the second type semiconductor layer, and a strain releasing layer between the first portion and the second portion and comprising a first layer including Indium, a second layer including Aluminum on the first layer, and a third layer including Indium on the second layer, wherein the Indium concentration of the third layer is higher than that of the first layer.

13 Claims, 3 Drawing Sheets

US 9,087,946 B2

LIGHT EMITTING DEVICE

TECHNICAL FIELD

The present application relates to a light-emitting device with an improved structure to improve the active layer performance.

DESCRIPTION OF BACKGROUND ART

As the light-emitting efficiency is increased and the cost of manufacturing is decreased, the dream for solid lighting device to replace the traditional lighting device may come true in recent years. Generally speaking, white light is provided by using blue light emitted from a light-emitting diode (LED) formed by a nitride semiconductor to excite the yellow phosphor. A nitride semiconductor including nitrogen (N) is a prime candidate to make a short-wave light-emitting device because its band-gap is sufficiently wide. Among other things, GaN-based compound semiconductors have been researched and developed particularly extensively. As a result, blue LEDs, green LEDs, and semiconductor laser diodes made of GaN-based semiconductors have already been used in actual products.

FIG. 1 shows the structure of the conventional nitride semiconductor LED 1. The conventional nitride semiconductor LED 1 comprises an n-type semiconductor 2, a multiple quantum well structure 4 and a p-type semiconductor layer 6. Usually, the n-type semiconductor 2 is an n-type GaN, and the p-type semiconductor layer 6 is a p-type GaN. In order to raise the light-emitting efficiency of the nitride semiconductor LED 1, the multiple quantum well structure 4 of the nitride semiconductor LED comprises a plurality of barrier layers 41 and well layers 42 different from the barrier layers 41. The plurality of the barrier layers 41 and the well layers 42 are alternately stacked with each other to form the traps to capture the electrons and holes to increase the combination efficiency thereof. Generally, the plurality of the barrier layers 41 comprises Ga and N, and preferably is GaN. The plurality of the well layers 42 comprises In, Ga, and N, and preferably is InGaN. Nevertheless, the lattice constant of the GaN does not match the lattice constant of the InGaN so forms the strain in the multiple quantum well structure 4. The strain causes the defects in the multiple quantum well structure 4 and decreases the light-emitting efficiency.

SUMMARY OF THE DISCLOSURE

A light-emitting device comprises a first type semiconductor layer, a multi-quantum well structure on the first type semiconductor layer, and a second type semiconductor layer on the multi-quantum well structure, wherein the multi-quantum well structure comprises a first portion near the first type semiconductor layer, a second portion near the second type semiconductor layer, and a strain releasing layer between the first portion and the second portion and comprising a first layer including Indium, a second layer including Aluminum on the first layer, and a third layer including Indium on the second layer, wherein the Indium concentration of the third layer is higher than that of the first layer.

A method of manufacturing a light-emitting device comprising the steps of, providing a substrate, forming a first type semiconductor layer on the substrate, forming a first portion on the first type semiconductor layer at a first temperature T1, forming a strain releasing layer on the first type semiconductor layer, forming a second portion on the strain releasing layer at a second temperature T2, and forming a second type semiconductor layer on the multi-quantum well structure, wherein T1>T2.

DETAILED DESCRIPTION OF PREFERRED EMBODIMENTS

Figure 1:
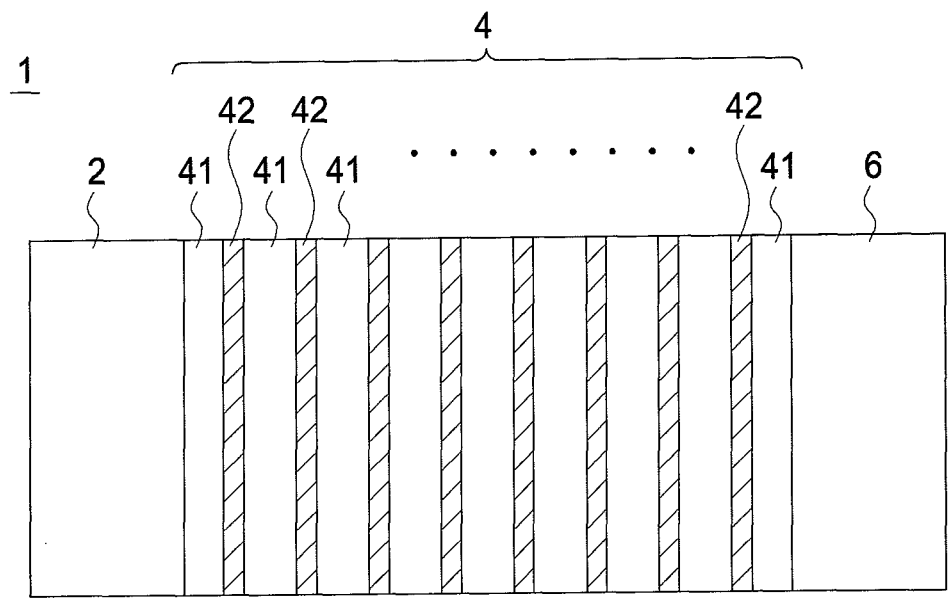
FIG. 1 shows the structure of the conventional nitride semiconductor LED.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

Figure 2:
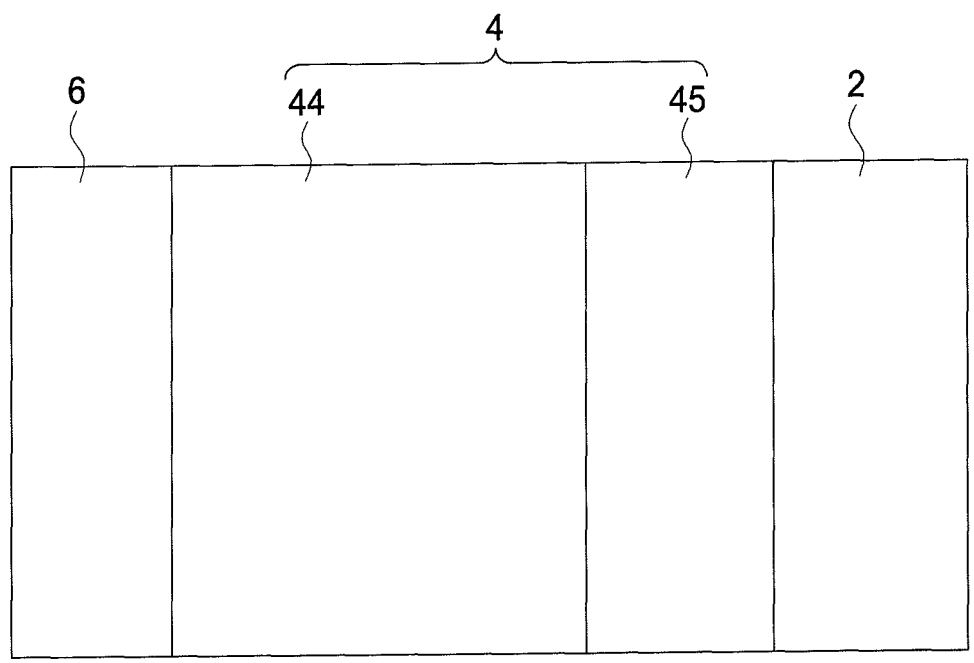
FIG. 2 shows the light-emitting diode structure according to the first embodiment of the present application.

As FIG. 2 shows, the light-emitting diode structure comprises an n-type semiconductor layer 2, a p-type semiconductor layer 6, and a multiple quantum well structure 4 between the n-type semiconductor layer 2 and the p-type semiconductor layer 6. The material of the n-type semiconductor layer 2, the multiple quantum well structure 4, and the p-type semiconductor layer 6 can be the compounds which at least include nitride. In order to reduce the defects in the multiple quantum well structure 4, the multiple quantum well structure 4 is divided into the first portion 45 and the second portion 44. The first portion 45 comprises a plurality of the first barrier layers and the first well layers different from the first barrier layers. The plurality of the first barrier layers and the first well layers are alternately stacked with each other. The plurality of the first barrier layers comprises Ga and N, and preferably comprises $Ga_xN$, $0<x<1$. The plurality of the first well layers comprises In, Ga, and N, and preferably comprises $In_zGa_{1-z}N$, $0<z<1$. The second portion 44 comprises a plurality of the second barrier layers and the second well layers different from the second barrier layers. The plurality of the second barrier layers and the second well layers are alternately stacked with each other. The plurality of the second barrier layers comprises Ga and N, and preferably comprises $Ga_xN$, $0<x<1$. The plurality of the second well layers comprises In, Ga, and N, and preferably comprises $In_yGa_{1-y}N$, $z<y<1$.

In the first embodiment, the first portion 45 is formed in a higher temperature than the second portion 44. Thus, the first portion 45 can be called as HT-MQW (high temperature multiple quantum well), and the second portion 44 can be called as LT-MQW (low temperature multiple quantum well). The second portion 44, which comprises higher Indium (In) concentration, is used for the main light-emitting structure of the multiple quantum well structure 4. The first portion 45, which comprises lower Indium (In) concentration, can be a super lattice structure to release the strain which has be accumulated in the n-type semiconductor layer 2 and decrease the strain occurred in the second portion 44. Since the strain can cause the defects occurring during the process of forming the second portion 44, the defects in second portion 44 can be decreased. Because the first portion 45 is formed in higher temperature than the second portion 44, the epitaxial quality of the first portion 45 is better than that of the second portion 44. Thus, the first portion 45 can prevent the defects which occur in the semiconductor layer 2 from spreading to the second portion 44 to reduce the number of defects thereof.

Second Embodiment

Figure 3:
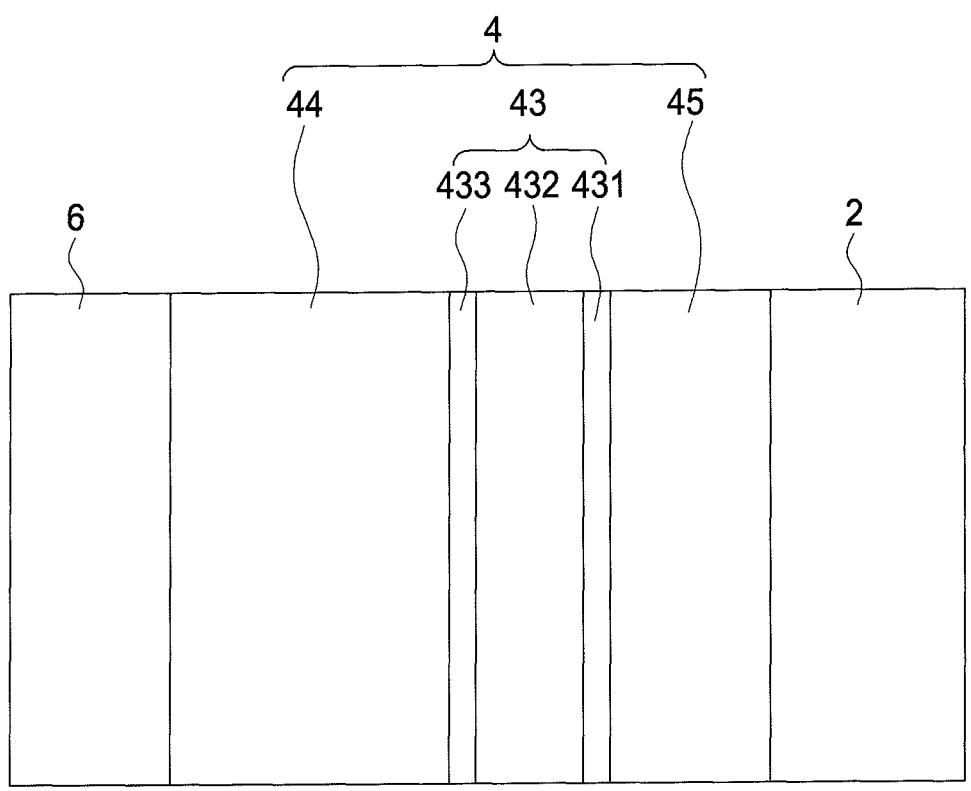
FIG. 3 shows the light-emitting diode structure according to the second embodiment of the present application.

FIG. 3 shows the light-emitting diode structure according to the second embodiment of the present application. The light-emitting diode structure comprises an n-type semiconductor layer 2, a p-type semiconductor layer 6, and a multiple quantum well structure 4 between the n-type semiconductor layer 2 and the p-type semiconductor layer 6. The material of the n-type semiconductor layer 2, the multiple quantum well structure 4, and the p-type semiconductor layer 6 can be the compounds which at least include nitride. The difference between the second embodiment and the first embodiment is that the multiple quantum well structure 4 comprises the first portion 45, the second portion 44, and a strain releasing layer 43 between the first portion 45 and the second portion 44. The strain releasing layer 43 comprises the first layer 431, the second layer 432, and the third layer 433. The first layer 431 and the third layer 433 are both the compounds of In, Ga, and N. The second layer 432 is the compound of Al, Ga, and N. The concentration of In of the first layer 431 is smaller than that of the third layer 433. The concentration of Al of the second layer 432 is between 0.08 and 0.15. The thickness of the second layer 432 is between 100 Å and 300 Å. The second layer 432 is thicker than the first barrier layer of the first portion 45 and the second barrier layer of the second portion 44. In another embodiment, the second layer 432 can be doped with Si or P to become an n-type compound.

According to a general research, the hetero junction of the compound of Al, Ga and N, and the compound of In, Ga and N can compensate the strain, wherein the strain is caused from the lattice mismatch of GaN and InGaN. Thus, the two hetero junctions, which are the first layer 431 and the second layer 432, and the second layer 432 and the third layer 433, can compensate the strain in the second portion 44 and meanwhile decrease the defects in the second portion 44 to increase the light-emitting efficiency.

In addition, the process of manufacturing the multiple quantum well structure 4 comprises the steps of forming the first portion 45 first, then forming the strain releasing layer 43, and finally forming the second portion 44. The forming temperature of the first portion 45 is near to that of the second layer 432. Thus, during the process of forming the second layer 432, the first portion 45 is not damaged. After the strain releasing layer 43 are formed, the second portion 44 can be formed in lower temperature to prevent the plurality of the second barrier layers and the second well layers of the second portion 44 from being damaged.

Because the defects in the second portion 44 can be reduced, the light-emitting efficiency of the multiple quantum well structure 4 can be improved and the forward voltage of the light-emitting diode can also be improved. And, on the other hand, the light-emitting efficiency of the multiple quantum well structure 4 can be more average in low and high temperature environments, which can improve the droop effect.

Third Embodiment

Figure 4A:
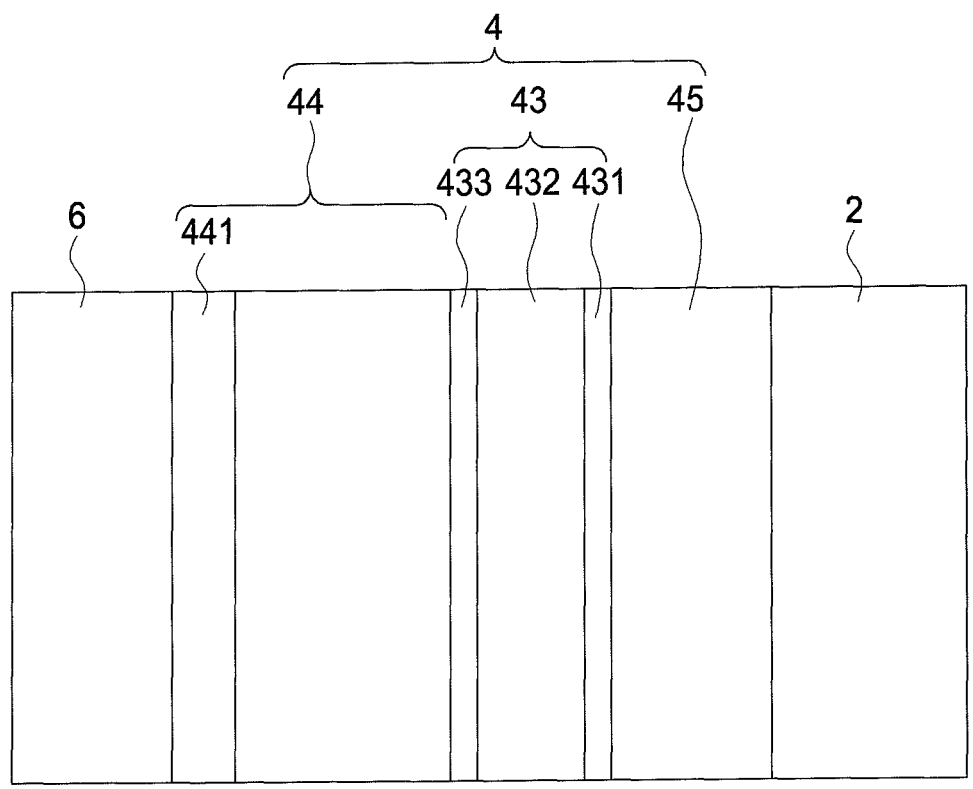
FIG. 4A shows the light-emitting diode structure according to the third embodiment of the present application.

FIG. 4A shows the light-emitting diode structure according to the third embodiment of the present application. The difference between the third embodiment and the second embodiment is that the second portion 44 comprises an electron block layer 441 adjacent to the p-type semiconductor layer 6, and the electron block layer 441 can preferably be connected with the p-type semiconductor layer 6 and the second barrier layer of the second portion 44. The electron block layer 441 is the compound of Aluminum, gallium and nitride, and can be doped with Mg or Be to form a p-type compound.

Figure 4B:
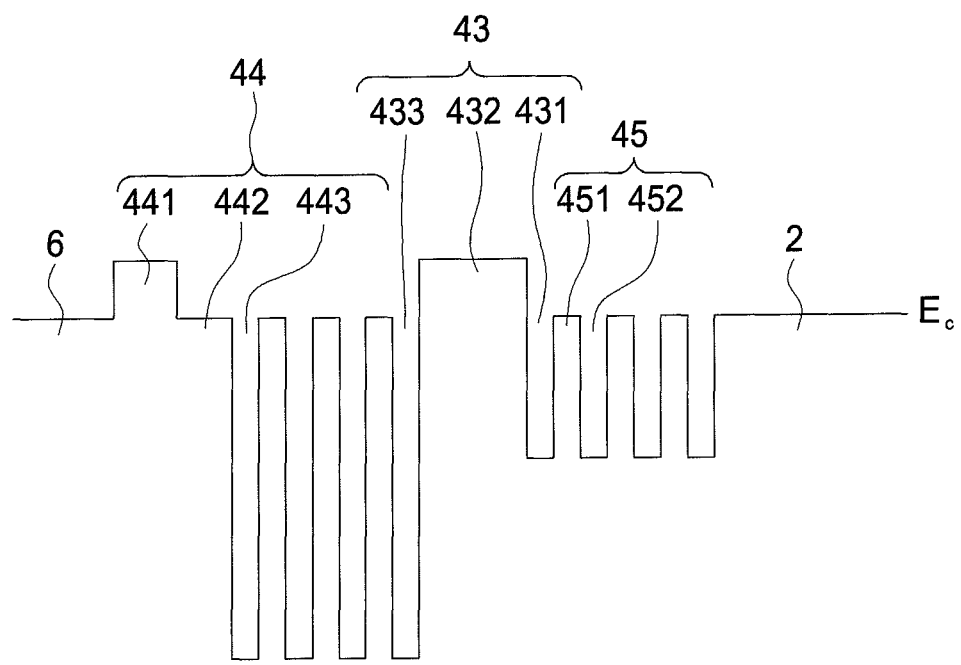
FIG. 4B shows the energy level of the conductive band ($E_c$) of the light-emitting diode structure according to the third embodiment of the present application.

The concentration of Aluminum of the electron block layer 441 is between 0.08 and 0.15. The energy level of the conductive band ($E_c$) of the light-emitting diode structure is shown in FIG. 4B. The energy level of conductive band ($E_c$) of the first barrier layer 451 is higher than the energy level of conductive band ($E_c$) of the first well layer 452. The energy level of conductive band ($E_c$) of the second barrier layer 442 is higher than the energy level of conductive band ($E_c$) of the second well layer 443. And, because the Indium (In) concentration of the first well layer is lower than that of the second well layer, the energy levels of conductive band ($E_c$) of the second well layers 443 are lower than that of the first well layers 452.

The energy levels of the conductive band ($E_c$) of the electron block layer 441 and the second layer 432 are higher than that of other portions of the light-emitting diode structure. The electron block layer 441 and the second layer 432 can form the obstruction for the electronics flowing from the n-type semiconductor layer 2 to the p-type semiconductor layer 6. Thus, the electron block layer 441 and the second layer 432 can improve the recombination percentage of the electrics from the n-type semiconductor layer 2 and the electrons respectively from the p-type semiconductor layer 6. When the recombination percentage of the electrics and the electrons is improved, the light-emitting efficiency of the multiple quantum well structure 4 can be improved.

What is claimed is:
1. A light-emitting device, comprising:
a first type semiconductor layer;
a multi-quantum well structure on the first type semiconductor layer; and
a second type semiconductor layer on the multi-quantum well structure,
wherein the multi-quantum well structure comprises a first portion near the first type semiconductor layer, a second portion near the second type semiconductor layer, and a strain releasing layer between the first portion and the second portion and comprising a first layer including Indium, a second layer including Aluminum on the first layer, and a third layer including Indium on the second layer, wherein the Indium concentration of the third layer is higher than that of the first layer,
wherein the first portion comprises a plurality of first well layers and a plurality of first barrier layers alternately stacked, and the second portion comprises a plurality of second well layers and a plurality of second barrier layers alternately stacked, and
wherein the energy level of the conduction band of the second layer is higher than that of the plurality of first well layers, the plurality of first barrier layers, the plurality of second well layers, and the plurality of second barrier layers.

2. A light-emitting device according to claim 1, wherein the second layer comprises Si or P.

3. A light-emitting device according to claim 1, wherein a thickness of the second layer is between 100 Å and 300 Å.

4. A light-emitting device according to claim 1, wherein the plurality of first well layers comprises Indium.

5. A light-emitting device according to claim 1, wherein the second layer is thicker than each of the plurality of first barrier layers.

6. A light-emitting device according to claim 4, wherein the plurality of second well layers comprises Indium.

7. A light-emitting device according to claim 6, wherein the first type semiconductor layer comprises an n-type semiconductor layer, the second type semiconductor layer comprises a p-type semiconductor layer, and the Indium concentration of the plurality of second well layers is higher than that of the plurality of first well layers.

8. A light-emitting device according to claim 1, wherein the second portion further comprises an electron block layer near the second type semiconductor layer.

9. A light-emitting device according to claim 8, wherein the electron block layer comprises Aluminum.

10. A light-emitting device according to claim 9, wherein the energy level of the conduction band of electron block layer is higher than that of the plurality of first well layers, the plurality of first barrier layers, the plurality of second well layers, and the plurality of second barrier layers.

11. A light-emitting device according to claim 8, wherein the electron block layer is doped with Mg or Be.

12. A light-emitting device according to claim 8, wherein the energy level of the conduction band of the electron block layer is higher than that of the plurality of second well layers and the plurality of second barrier layers.

13. A light-emitting device according to claim 1, wherein the second portion emits a blue light.

* * * * *